United States Patent [19]

Hotta et al.

[11] Patent Number: 4,619,035
[45] Date of Patent: Oct. 28, 1986

[54] METHOD OF MANUFACTURING A SEMICONDUCTOR DEVICE INCLUDING SCHOTTKY BARRIER DIODES

[75] Inventors: Tadahiko Hotta; Shingo Sakakibara, both of Hamamatsu, Japan

[73] Assignee: Nippon Gakki Seizo Kabushiki Kaisha, Hamamatsu, Japan

[21] Appl. No.: 747,175

[22] Filed: Jun. 21, 1985

[30] Foreign Application Priority Data

Jun. 23, 1984 [JP] Japan .................. 59-129681
Jul. 5, 1984 [JP] Japan .................. 59-139644

[51] Int. Cl.⁴ .................................. H01L 21/40
[52] U.S. Cl. .................................. 29/576 C; 29/590; 148/1.5; 148/DIG. 19; 148/DIG. 147; 357/15; 357/67; 427/84; 427/89
[58] Field of Search .......... 29/590, 576 C; 357/15, 357/67, 67 S; 427/84, 89; 148/DIG. 19, DIG. 147, 1.5

[56] References Cited

U.S. PATENT DOCUMENTS 4,107,835 8/1978 Bindell et al. .................. 357/15
4,394,673 7/1983 Thompson et al. .............. 357/15

FOREIGN PATENT DOCUMENTS 18973 2/1978 Japan .............................. 427/84

OTHER PUBLICATIONS

Ghandi, V.L.S.I. Fabrication Principles Silicon and Germanium Arsenide, John Wiley & Sons, New York, 1983, pp. 435-436.
IEEE Journal of Solid-State Circuits, vol. SC-19, No. 2, Apr. 1984, STL Versus ISL: An Experimental Comparison, Frank W. Hewlett, Jr.

Primary Examiner—Brian E. Hearn
Assistant Examiner—John T. Callahan
Attorney, Agent, or Firm—Cushman, Darby & Cushman

[57] ABSTRACT

A method of manufacturing a semiconductor device manufactures a semiconductor device provided with plural kinds of Schottky barrier diodes having different forward voltages on one substrate. The method includes (a) a step of forming at least one Schottky barrier diode of a first kind, and (b) a step of forming at least one Schottky barrier diode of a second kind. The step (a) is performed by placing a first metal layer at a first surface part of a silicon substrate, and then by silicifying the first metal layer. The step (b) is performed by plating, at a second surface part of the silicon substrate which is different from the first surface part of the silicon substrate, a second metal layer which consists of a metal different from the metal consisting of the first metal layer and then by silicifying the second metal layer. Thus a semiconductor device provided with plural kinds of Schottky barrier diodes having different forward voltages on one substrate which is suitable for STL (Schottky Transistor Logic) etc. is obtained.

6 Claims, 6 Drawing Figures

METHOD OF MANUFACTURING A SEMICONDUCTOR DEVICE INCLUDING SCHOTTKY BARRIER DIODES

BACKGROUND OF THE INVENTION (a) Field of the Invention

The present invention relates to a method of manufacturing a semiconductor device provided on one substrate with Schottky barrier diodes having different characteristics.

(b) Description of the Prior Art

It is generally well known that the forward voltage of a Schottky barrier diode is determined by the barrier height, which depends on the impurity concentration of the semiconductor surface and the material of the metal to be in contact with the semiconductor surface.

In order to form plural kinds of Schottky barrier diodes having different forward voltages on one substrate, there already known, for example, (i) a method of varying the impurity concentration of the substrate surface, for example, by ion implantation and (ii) a method of changing the metal to be in contact with the substrate surface.

According to the above mentioned method (i), the Schottky barrier diode of a low forward voltage has such problems as the increase of the leakage current, the reduction of the peak inverse voltage and the deterioration of the operating margin at a high temperature.

According to the above mentioned method (ii), the Schottky barrier diode of a low forward voltage is formed by the ohmic contact of such metal as, for example, tantalum (Ta) or a titanium-tungsten (Ti-W) alloy with a silicon substrate surface and has problems that the instability of the substrate surface causes the instability of the characteristics of the Schottky barrier diode and that it is difficult to obtain a desired forward voltage with only the selection of the metal material.

SUMMARY OF THE INVENTION

An object of the present invention is to provide a method of manufacturing a semiconductor device provided with Schottky barrier diodes having different forward voltages on one substrate whereby the method can produce Schottky barrier diodes having no such problems as the increase of the leakage current, the reduction of the peak inverse voltage and the deterioration of the operating margin at a high temperature and having stabilized characteristics.

This object is obtained by a method of manufacturing a semiconductor device provided with Schottky barrier diodes having different forward voltages on one substrate comprising:

(a) a step of forming at least one Schottky barrier diode of a first kind, by placing a first metal layer at a first surface part of a silicon substrate, and then by silicifying said first metal layer; and (b) a step of subsequently forming at least one Schottky barrier diode of a second kind, by placing, at a second surface part of said silicon substrate which is different from said first surface part, a second metal layer which consists of a metal different from the metal consisting of said first metal layer and then by silicifying said second metal layer.

This method is preferably further constructed in such way that said second metal layer is silicified at a temperature lower than the temperature at which the first metal layer is silicified.

Further, this method is preferably constructed in such way that said second metal layer is applied to coat the first surface part of said silicon substrate in addition to the second surface part of said silicon substrate.

Furthermore, this method is preferably constructed in such way that said first metal layer is silicified so that the depth of the first silicide-silicon interface thereby may be comparatively deep and said second metal layer is silicified so that the depth of the second silicide-silicon intrface thereby may be comparatively shallow.

According to the present invention, as each Schottky barrier diode is formed by successively silicifying the metal layer coated on the substrate, in comparison with the method of varying the impurity concentration of the substrate surface, such problems as the increase of the leakage current, the reduction of the peak inverse voltage and the deterioration of the operating margin at a high temperature will not occur and, as the rectifying junction is formed not by the ohmic contact of the metal-semiconductor (silicon) but by the interface of the silicide-semiconductor (silicon), in comparison with the method of changing the material of the metal to be in contact with the substrate surface, stabilized diode characteristics will be obtained.

Further, if the second metal layer is applied also to coat the first surface part in addition to the second surface part of the silicon substrate so as to cover the first kind of Schottky barrier diode, the selective etching process will become unnecessary. If the second metal layer is silicified so that the depth of the silicide-silicon interface may be shallower than the depth of the silicide-silicon interface by the silicification of the first metal layer, during the silicification of the second metal layer, the second metal layer will be silicified with the silicide of the first metal layer forming the first kind of Schottky barrier diodes so that the depth of the silicide-silicon interface thereby may not exceed that of the above mentioned first silicide-silicon interface and the barrier height of the first kind of Schottky barrier diodes will not be influenced by the silicification of the second metal layer.

The other features of the present invention will become more apparent from the following detailed description and appended claims.

DESCRIPTION OF THE PREFERRED EMBODIMENT

The present invention will be explained hereunder based on an embodiment with reference to the drawings.

FIG. 1 successively shows the respective steps (a) to (f) of the manufacturing process of the embodiment.

Figure 1A:
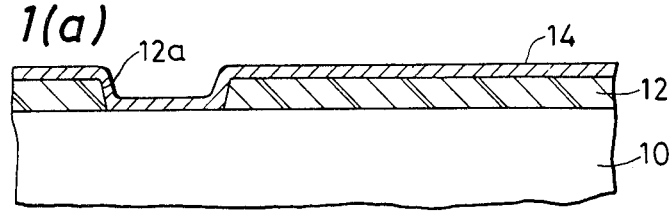
FIGS. 1(a)–(f) are sectioned views of a substrate, showing the manufacturing steps by an embodiment of the method of manufacturing a semiconductor device according to the present invention.

First of all, in FIG. 1(a), when a surface of a silicon substrate 10 is heat-oxidized, an insulating layer 12 consisting of $SiO_2$ is formed on the surface of the silicon substrate 10, and then, by ordinary photoetching, a hole 12a which exposes a part of the substrate 10 is made through the insulating layer 12, and thereafter, by sputtering or vacuum evaporation, a first metal layer 14 consisting of a metal (for example, plutinum) having a relatively high silicide-forming temperature will be applied to coat the entire upper surface of the substrate 10.

Figure 1B:
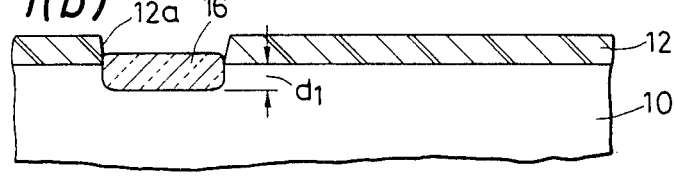

Then, in FIG. 1(b), when it is heat-treated at a comparatively high temperature $T_1$, the part of the first metal layer 14 which is in contact with the silicon substrate 10 within the hole 12a reacts with the silicon substrate 10 to form a first silicide layer 16 with a depth $d_1$ of the silicide-silicon interface, and thereafter, the remaining part, that is, the unreacting part of the first metal layer 14 is removed by etching.

Figure 1C:
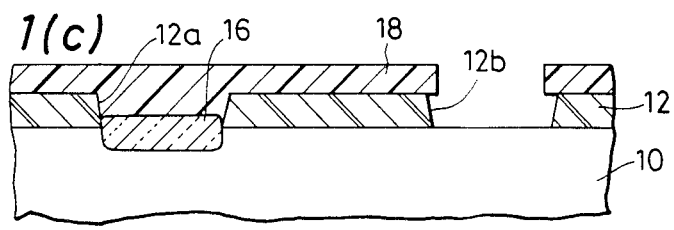

Then, in FIG. 1(c), when the substrate is applied on its entire upper surface with a photoresist layer 18 and the insulating layer 12 is selectively etched by using the photoresist layer 18 as a mask, a hole 12b which exposes a surface part of the silicon substrate 10 different from the surface part of the silicon substrate 10 corresponding to the hole 12a will be made through the insulating layer 12.

Figure 1D:
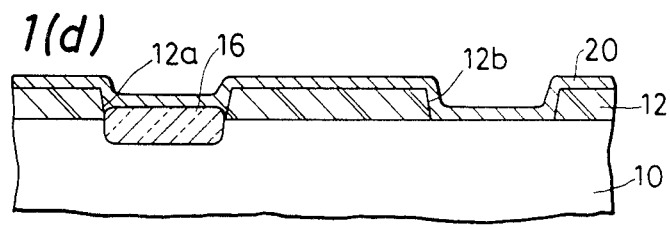

Further, in FIG. 1(d), after the photoresist layer 18 applied to coat the substrate on the upper surface is removed, by sputtering or vacuum evaporation, a second metal layer 20 consisting of a metal (for example, titanium) different from the metal forming the first metal layer 14 and having a relatively low silicide-forming temperature is applied to coat the substrate over the entire upper surface.

Figure 1E:
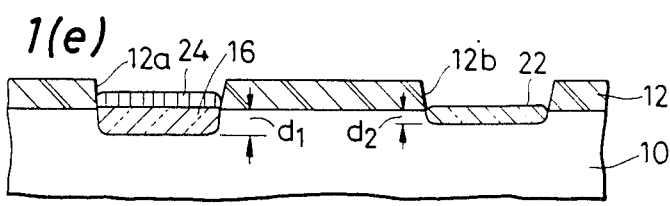

Then, in FIG. 1(e), by heat-treatment at a comparatively low temperature, that is, at a temperature $T_2$ lower than the above mentioned temperature $T_1$, the part of the second metal layer 20 which is in contact with the silicon substrate 10 within the hole 12b reacts with the silicon substrate 10 to form a second silicide layer 22 with a depth $d_2$ of the silicide-silicon interface in the region of the hole 12b. In this case, the part of the second metal layer 20 which is in contact with the above mentioned first silicide layer 16 reacts with the silicide layer 16 to form a third silicide layer 24 but, as the thicknesses of the respective metal layers 14 and 20 are so selected that the depth $d_1$ of the silicide-silicon interface of the silicide layer 16 may be larger than the depth $d_2$ of the silicide-silicon interface of the second silicide layer 22, the second metal layer 20 does not react with the full thickness of the first silicide layer 16 and, in the part of contact with the silicon substrate 10, the first silicide layer 16 remains without influenced in its barrier height by the third silicide layer 24. Thereafter, by etching, the remaining part, that is, the unreacting part of the second metal layer 20 is removed.

Figure 1F:
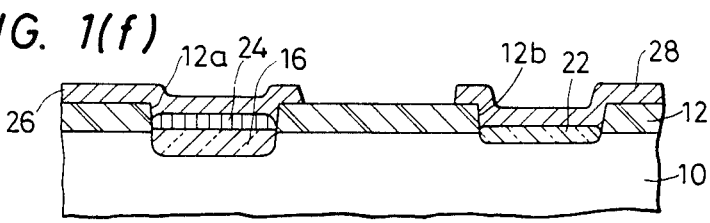

Finally, in FIG. 1(f), when such wiring metal as, for example, Al is evaporatively deposited and patterned, wiring layers 26 and 28 are formed on the upper surface of the substrate. Thus, with respect to the wiring layer 26, between the first silicide layer 16 and the silicon substrate 10, the first kind of Schottky barrier diode is formed and, with respect to the wiring layer 28, between the second silicide layer 22 and the silicon substrate 10, the second kind of Schottky barrier diode is formed.

Thus, a semiconductor device provided with plural kinds of Schottky barrier diodes having different forward voltages on one substrate is obtained. Such effects as in the following will be obtained; that is to say:

(1) As different forward voltages are not obtained by making the inpurity concentration on the substrate surface different for the respective Schottky barrier diodes, such problems as the increase of the leakage current, the reduction of the peak inverse voltage and the deterioration of the operating margin at a high temperature will not occur.

(2) As the respective Schottky barrier diodes are formed to have a rectifying junction on the silicide-silicon interface, stabilized diode characteristics will be obtained.

(3) As the forward voltages for the respective Schottky barrier diodes can be determined by the selection of the metal material and the control of the depth of the silicide-silicon interface, a desired forward voltage will be easily obtained.

(4) As the second metal layer can be applied to coat the substrate over the entire upper surface, and its selective etching is unnecessary, the steps will be simple and further, as the first silicide layer is formed to be deeper than the second silicide layer, the change of the barrier height, that is, such characteristic change as of the forward voltage in the first Schottky barrier diode can be prevented, and the first silicide layer need not be covered and therefore the steps will be simple.

Therefore, according to the present invention, a semiconductor device of favorable characteristics provided with Schottky barrier diodes having different forward voltages on one substrate can be manufactured and can be effectively used, for example, for STL (Schottky Transistor Logic) and the like which has a single input and multi-outputs.

What is claimed is:

1. A method of manufacturing a semiconductor device provided with plural kinds of Schottky barrier diodes having different forward voltages on one substrate comprising:
   (a) forming at least one Schottky barrier diode of a first kind, by:
      (i) placing a first metal layer on a first surface part of a surface of a silicon substrate, and then
      (ii) silicifying said first metal layer; and thereafter
   (b) forming at least one Schottky barrier diode of a second kind, by
      (i) placing a second metal layer indiscriminately both on said first surface part of said silicon substrate as a coating upon each said Schottky barrier diode of said first kind and on a second surface part of said silicon substrate which is different from said first surface part, this second metal layer consisting essentially of a metal which is different from that of said first metal layer, and then
      (ii) without first patterning said second metal layer, silicifying said second metal layer.

2. A method according to claim 1 characterized in that said second metal layer is silicified at a temperature lower than the temperature at which the first metal layer is silicified.

3. A method according to claim 2 characterized in that said first metal layer is silicified so that the depth of the first silicide-silicon interface thereby may be comparatively deep and said second metal layer is silicified so that the depth of the second silicide-silicon interface thereby may be comparatively shallow.

4. A method according to claim 1 characterized in that said first metal layer is silicified so that the depth of the first silicide-silicon interface thereby may be comparatively deep and said second metal layer is silicified so that the depth of the second silicide-silicon interface thereby may be comparatively shallow whereby, the second metal layer is silicified with the silicide of the first metal layer forming the first kind of Schottky barrier diode thereunder so that the depth of the silicide-silicon interface thereby may not exceed that of said first silicide-silicon interface.

5. A method according to claim 1 characterized in that the metal forming the first metal layer is platinum (Pt) and the metal forming the second metal layer is titanium (Ti).

6. A method according to claim 1 characterized in that, prior to conducting step (a) said surface of said silicon substrate is provided with an insulating layer consisting essentially of SiO$_2$ except at said first surface part;

between conducting steps (a) and (b), the entire said surface is provided with a photoresist layer except at said second surface part; then said insulating layer is removed from said second surface part;

in conducting part (i) of step (b), the entire said surface of said silicon substrate is coated with said second metal layer; and after conducting part (ii) of step (b), remaining unreacted second metal of said second metal layer is removed.

* * * * *